United States Patent
Park et al.

(10) Patent No.: US 9,490,278 B2
(45) Date of Patent: Nov. 8, 2016

(54) PHOTO MASK AND METHOD OF MANUFACTURING THIN FILM TRANSISTOR USING THE SAME

(71) Applicant: SAMSUNG DISPLAY CO., LTD., Yongin, Gyeonggi-Do (KR)

(72) Inventors: Kwang-Woo Park, Hwaseong-si (KR); Jeong-Won Kim, Seoul (KR); Jun-Hyuk Woo, Seongnam-si (KR); Gwui-Hyun Park, Hwaseong-si (KR); Jin-Ho Ju, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/740,378

(22) Filed: Jun. 16, 2015

(65) Prior Publication Data
US 2016/0197106 A1 Jul. 7, 2016

(30) Foreign Application Priority Data
Jan. 6, 2015 (KR) ........................ 10-2015-0001361

(51) Int. Cl.
| H01L 27/32 | (2006.01) |
| H01L 27/12 | (2006.01) |
| G02B 5/30 | (2006.01) |
| G02B 1/08 | (2006.01) |
| G02F 1/13 | (2006.01) |
| G03F 1/38 | (2012.01) |

(52) U.S. Cl.
CPC ............ *H01L 27/1288* (2013.01); *G02B 1/08*
(2013.01); *G02B 5/3058* (2013.01); *G02F 1/1303* (2013.01); *G03F 1/38* (2013.01)

(58) Field of Classification Search
CPC ..................................................... G06F 19/00
See application file for complete search history.

(56) References Cited

U.S. PATENT DOCUMENTS

| 2004/0010385 A1* | 1/2004 | Fukuhara | G03F 7/706 702/83 |
| 2005/0046943 A1* | 3/2005 | Suganuma | G02B 5/3058 359/487.03 |
| 2008/0261127 A1* | 10/2008 | Progler | G03F 1/14 430/5 |
| 2015/0048048 A1* | 2/2015 | Slafer | G03F 7/0002 216/26 |

FOREIGN PATENT DOCUMENTS

| KR | 1019990054921 | 7/1999 |
| KR | 1020100125574 | 12/2010 |
| KR | 1020110038516 | 4/2011 |
| KR | 1020110110644 | 10/2011 |
| KR | 1020120044392 | 5/2012 |

* cited by examiner

*Primary Examiner* — Fernando L Toledo
*Assistant Examiner* — Valerie N Newton
(74) *Attorney, Agent, or Firm* — F. Chau & Associates, LLC

(57) ABSTRACT

According to an exemplary embodiment of the present invention, a photomask includes a transparent substrate and a polarizing pattern. A polarizing pattern is disposed on a transparent substrate. The polarizing pattern polarize light.

10 Claims, 13 Drawing Sheets

PHOTO MASK AND METHOD OF MANUFACTURING THIN FILM TRANSISTOR USING THE SAME

CROSS-REFERENCE TO RELATED APPLICATION

This application claims priority under 35 U.S.C. §119 to Korean Patent Application No. 10-2015-0001.361, tiled on Jan. 6, 2015 in the Korean Intellectual Property Office (KIPO), the disclosure of which is incorporated by reference herein in its entirety.

TECHNICAL FIELD

The present invention relates to a photo mask and a method of manufacturing a thin film transistor using the photo mask.

DISCUSSION OF THE RELATED ART

A liquid crystal display ("LCD") apparatus applies an electric field to liquid crystal molecules to adjust arrangements of the molecules so that optical characteristics of a liquid crystal cell is changed for displaying an image. Such optical characteristics include birefringence, optical activity, dichroism and/or light scattering.

The LCD apparatus includes a LCD panel to display the image. The LCD panel is manufactured by using photolithography and etching processes. In the photolithography process, various photomasks are used according to patterns to form. As the number of photomasks increases, the manufacturing costs of the LCD apparatus increase.

SUMMARY

According to an exemplary embodiment of the present invention, a photomask includes a transparent substrate and a polarizing pattern. A polarizing pattern is disposed on a transparent substrate. The polarizing pattern polarize light According to an exemplary embodiment of the present invention, a method of manufacturing a thin film transistor is provided as follows. A metal layer is formed on a base substrate. A photoresist layer is formed on the metal layer. Light polarized at a first polarizing degree is emitted by an exposure. A photomask is provided between the exposure and the photoresist layer to generate light polarized at a second polarizing degree. The photomask includes a transparent substrate and a polarizing pattern. The light polarized at the first polarizing degree is polarized by the polarizing pattern to a light polarized at a second polarizing degree. The photoresist layer is radiated with the light polarized at the second polarizing degree. An exposure amount of the light polarized at the second polarizing is decreased from an exposure amount of the light polarized at the first polarizing in accordance with a difference between the first and second polarizing degrees. A photoresist pattern is formed by developing the photoresist layer radiated by the light polarized at the second polarizing degree. The metal layer is etched by using the photoresist layer as an etch mask.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
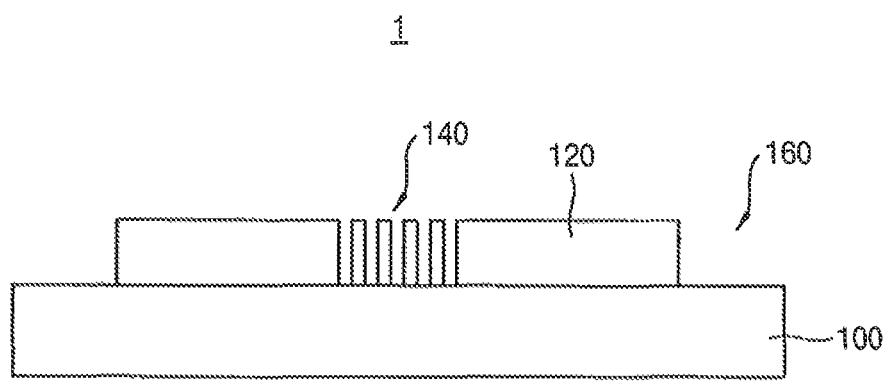
FIG. 1 is a cross-sectional view of a photo mask according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a cross-sectional view of a photo mask according to an exemplary embodiment of the present invention.

Referring to FIG. 1, a photo mask 1 includes a transparent substrate 100, a blocking pattern 120, a polarizing pattern 140 and a transmitting pattern 160.

The transparent substrate 100 may support the blocking pattern 120, the polarizing pattern 140 and the transmitting pattern 160, and the transparent substrate 100 may transmit light emitted by an exposure (not illustrated) to perform a exposure process. For example, the transparent substrate 100 may be a glass substrate or a transparent plastic substrate.

The exposure may emit the light polarized at a first polarizing angle. For example, the light may be polarized at the first polarizing angle by a polarizing filter of the exposure.

The blocking pattern 120 is disposed on the transparent substrate 100 to block the light. For example, the blocking pattern 120 may be formed of chromium (Cr). In a manufacturing process of a display device, the blocking pattern 120 is aligned with a base substrate such that a region of the base substrate covered by the blocking pattern 120 remains unetched in an etching process. In this case, a positive-type photoresist material may be provided on the base substrate. The display device may be formed on the base substrate.

Alternatively, the blocking pattern 120 may be provided on a region of the transparent substrate 100 corresponding to a region of the base substrate which is needed to be removed in an etching process. In this case, a negative-type photoresist material may be provided on the base substrate.

The polarizing pattern 140 is disposed on the transparent substrate 100 adjacent to the blocking pattern 120. In addition, the light polarized at the first polarizing angle may be incident on the polarizing pattern 140, and the polarizing pattern 140 may polarize the light at a second polarizing angle.

The polarizing pattern 140 may control an exposure amount by using a difference between the first and second polarizing angles. For example, if the first polarizing angle and the second polarizing angle are substantially the same as each other, the polarizing pattern 140 may transmit the entire light incident on the polarizing pattern 140. In addition, if the first polarizing angle is substantially perpendicular to the second polarizing angle, the polarizing pattern 140 may block the entire light incident on the polarizing pattern 140.

For example, the exposure amount may be inversely proportional to the difference between the first and second polarizing angles, and the exposure amount may be adjusted by the difference between the first and second polarizing angles.

In an exemplary embodiment of the present invention, the polarizing pattern 140 may include a wire grid pattern.

The wire grid pattern may be a stripe-like metal wire grid pattern having a line width and spacing that are smaller than the size of the respective wavelengths of red (R), green (G) and blue (B) light, e.g., within a visible light region detectable by human. The incident light in parallel to the stripe pattern may pass through the wire grid pattern, and the wire grid pattern may perform a polarizing process.

For example, the wire grid pattern may have a stripe pattern having a line width and spacing in a range of about 50 nm to about 200 nm, e.g., smaller than the minimum optical wavelength of light that is visible.

In an exemplary embodiment of the present invention, the wire grid pattern may include a high reflective material. For example, the wire grid pattern may be formed of aluminum (Al).

Alternatively, the polarizing pattern 140 may include a polarizing film formed of polymer resin. For example, the polarizing film may be formed of polyvinyl alcohol. The polarizing film may include light absorbing material which absorbs light vibrating in a specific direction.

The transmitting pattern 160 may be disposed on the transparent substrate 100 to transmit the light. The transmitting pattern 160 may be provided on a region of the transparent substrate 100 corresponding to a region of a base substrate (not illustrated) which is needed to be removed in an etching process. In this case, a positive-type photoresist material may be provided on the base substrate.

Alternatively, the transmitting pattern 160 may be provided on a region of the transparent substrate 100 corresponding to a region of the base substrate which is needed to be remained in an etching process. In this case, a negative-type photoresist material may be provided on the base substrate.

If a design value of a wire pattern formed by the photomasks is changed or if the design value is different from an actual value formed by the processes, an exposure amount of each photomask changes.

However, it is difficult to change the exposure amount of a pre-manufactured photomask, and a new photomask is needed. Accordingly, until the new photomask having a changed exposure amount is provided, a manufacturing process is stopped to affect productivity.

By a photo mask according to an exemplary embodiment of the present invention, the light emitted by the exposure and polarized at the first polarizing angle may be polarized at the second polarizing angle.

The difference between the first polarizing angle of the light by the polarizing filter of the exposure and the second polarizing angle of the light by the polarizing pattern of the photo mask may be adjusted to control the exposure amount using the photo mask. Accordingly, without replacement of the photo mask and stop of the manufacturing process, a thin film transistor may be manufactured continuously to increase productivity. In addition, the existing photo mask may be utilized and it may reduce production cost.

Hereinafter, a method of manufacturing a photo mask will be described in detail.

FIGS. 2 to 13 are cross-sectional views for illustrating a method of manufacturing a photo mask according to an exemplary embodiment of the present invention.

Figure 2:
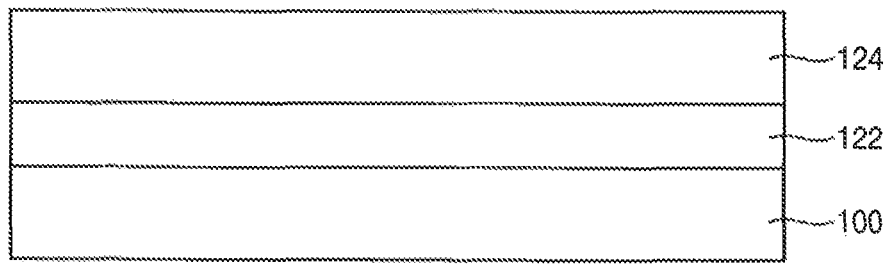
FIGS. 2 to 13 are cross-sectional views for illustrating a method of manufacturing a photo mask according to an exemplary embodiment of the present invention.

Referring to FIG. 2, a first metal layer 122 and a first photoresist layer 124 are sequentially stacked on a transparent substrate 100.

The transparent substrate 100 may be provided to support the first metal layer 122 and the first photoresist layer 124. In addition, the transparent substrate 100 may be provided to support material formed in subsequent processes.

By using Plasma Enhanced Chemical Vapor Deposition (PECVD), sputtering, or Atomic Layer Deposition (ALD) the first metal layer 122 may be stacked on the transparent substrate 100. In addition, the first metal layer 122 may be formed of chromium (Cr).

By using spin coating, spray or roller process, the first photoresist layer 124 may be stacked on the first metal layer 122. For example, the first photoresist layer 124 may be formed of a positive-type photoresist material. Alternatively, the first photoresist layer 124 may be formed of a negative-type photoresist material.

Figure 3:
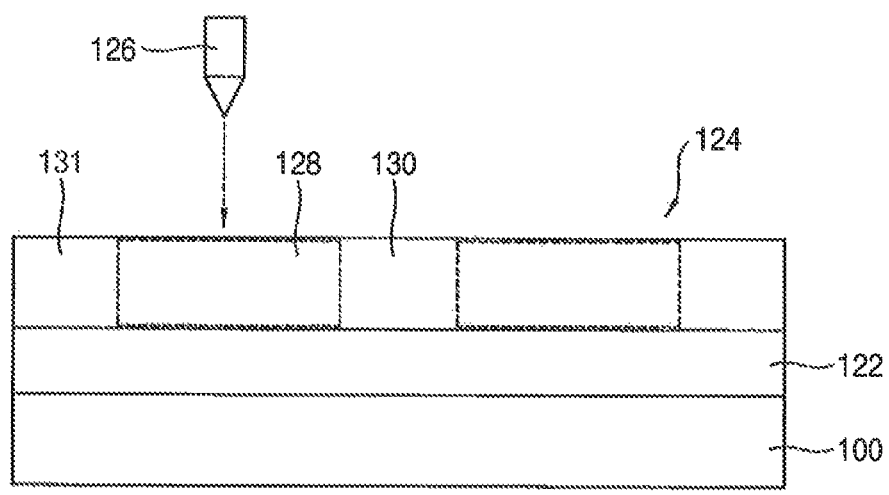

Referring to FIGS. 1 and 3, the first photoresist layer 124 is radiated by a laser beam emitted by a laser machine 126.

For example, the first photoresist layer 124 includes a first region 128 corresponding to a blocking pattern 120, a second region 130 corresponding to a polarizing pattern 140 and a third region 131 corresponding to a transmitting pattern 160.

The first region 128 of the first photoresist layer 124 is radiated by the laser beam emitted by the laser machine 126. The first region 128 of the first photoresist layer 124 may be hardened by the laser beam.

The second and third regions 130 and 131 of the first photoresist layer 124 are not radiated by the laser beam, and the second and third regions 130 and 131 are removed in a subsequent photoresist removing process.

Figure 4:
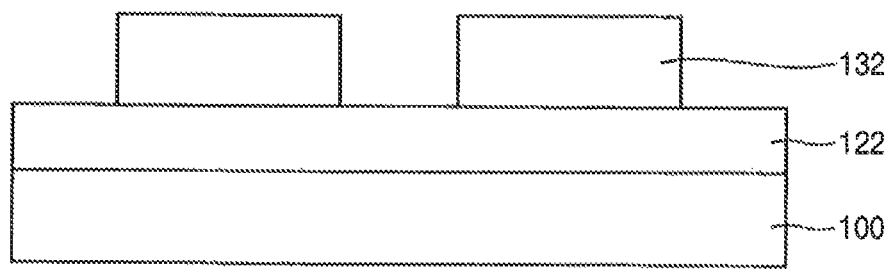

Referring to FIG. 4, the second and third regions 130 and 131 are removed by a developer.

The first region 128 of the first photoresist layer 124 which is hardened by the laser beam is not removed by the developer, remaining on the first metal layer 122.

Accordingly, by removing the second and third regions 130 and 131 of the first photoresist layer 124, the first photoresist layer 124 is transformed into the first photoresist pattern 132.

Figure 5:
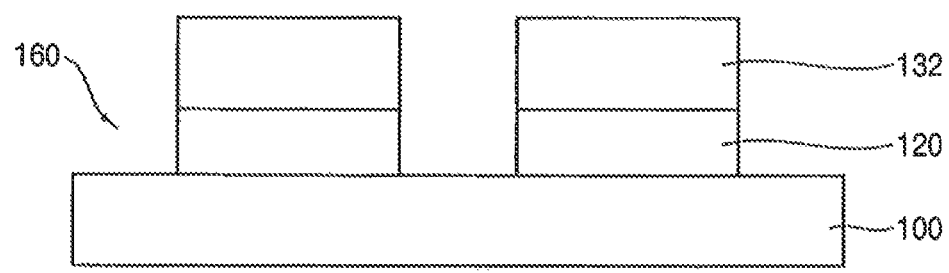

Referring to FIG. 5, the first metal layer 122 is etched by using the first photoresist pattern 132 as an etching mask.

For example, the first metal layer 122 is etched in a dry etching process using plasma such as PECVD, or a wet etching process.

Accordingly, by removing a portion of the first metal layer 122, the first metal layer 122 is transformed into the blocking pattern 120 and the transmitting pattern 160. The blocking pattern 120 blocks incident light, and the transmitting pattern 160 transmits the incident light.

Figure 6:
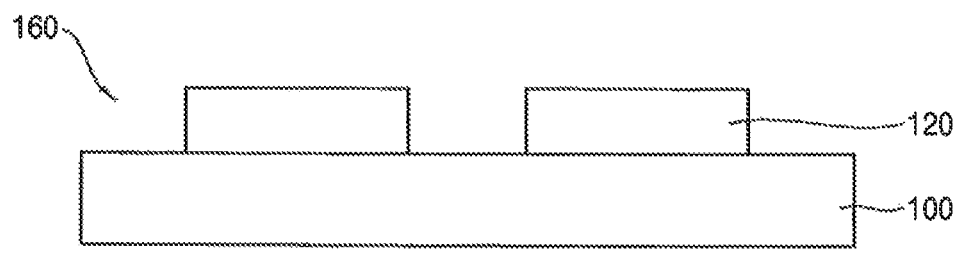

Referring to FIG. 6, the blocking pattern 120 is exposed by removing the first photoresist pattern 132.

For example, a cleaning process such as an asking process may be performed to remove the first photoresist pattern 132.

Figure 7:
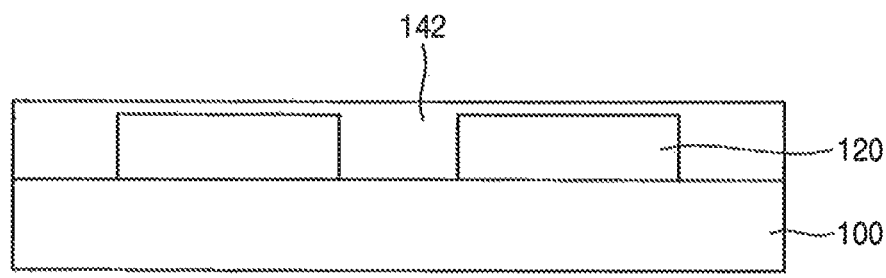

Referring to FIG. 7, a second metal layer 142 is stacked on the blocking pattern 120 and the transparent substrate 100.

A layer deposition process such as Plasma Enhanced Chemical Vapor Deposition (PEVCD), sputtering, Atomic Layer Deposition (ALD) may be performed to stack the second metal layer 142 on the blocking pattern 142 and the transparent substrate 100.

The second metal layer 142 may be formed of a high reflective metal. For example, the second metal layer 142 may include aluminum (Al). Alternatively, the second metal layer 142 may be formed of a black matrix.

Figure 8:
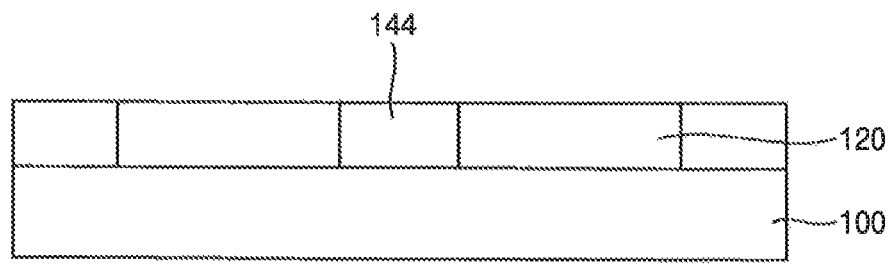

Referring to FIG. 8, the second metal layer 142 is planarized until a top surface of the blocking pattern 120 is exposed to form a metal layer pattern 144 filling the transmitting portion 160.

For example, the planarization process may be performed by a chemical mechanical polishing (CMP) process and/or an etch back process.

Figure 9:
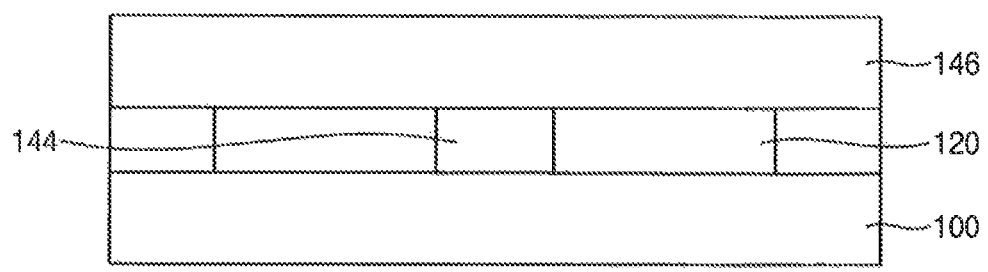

Referring to FIG. 9, a second photoresist layer 146 is stacked on the blocking pattern 120 and the metal layer pattern 144.

By using spin coating, spray or roller process, the second photoresist layer 146 may be stacked on the blocking pattern 120 and the metal layer pattern 144. For example, the second photoresist layer 146 may be formed of a positive-type photoresist material. Alternatively, the second photoresist layer 146 may be formed of a negative-type photoresist material.

Figure 10:
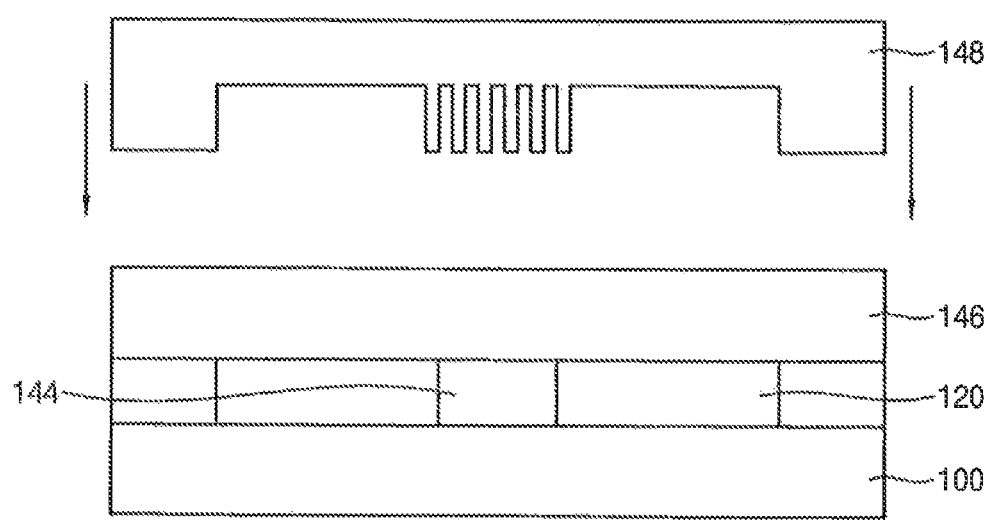

Referring to FIG. 10, a stamp 148 having a stripe pattern thereon is aligned over the transparent substrate 100, and the second photoresist layer 146 is compressed with the stamp 148.

For example, an aligning unit may align the stamp 148 over the transparent substrate 100, and a compressing unit may compress the second photoresist layer 146 with the stamp 148.

Then, while the second photoresist layer 146 is compressed with the stamp 148, the second photoresist layer 146 may be hardened by heat.

Figure 11:
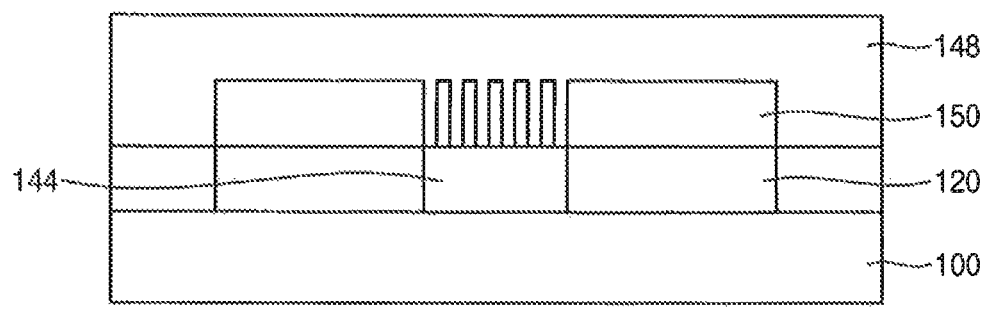
Figure 12:
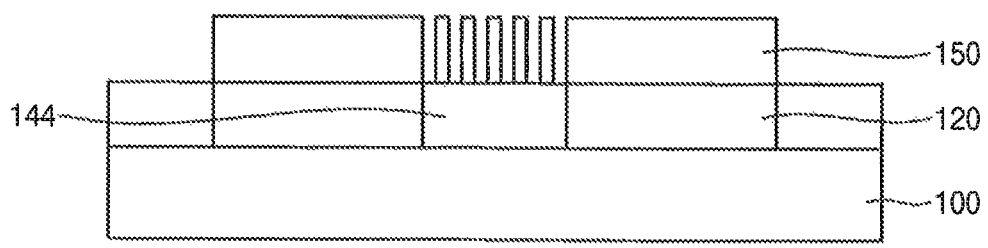

Referring to FIGS. 11 and 12, the stamp 148 is removed to form a second photoresist pattern 150 on the blocking pattern 120 and the metal layer pattern 144.

The stripe pattern of the stamp 148 is transferred to the second photoresist layer 146, and the second photoresist layer 146 is transformed into the second photoresist pattern 150 by the stamp 148.

Figure 13:
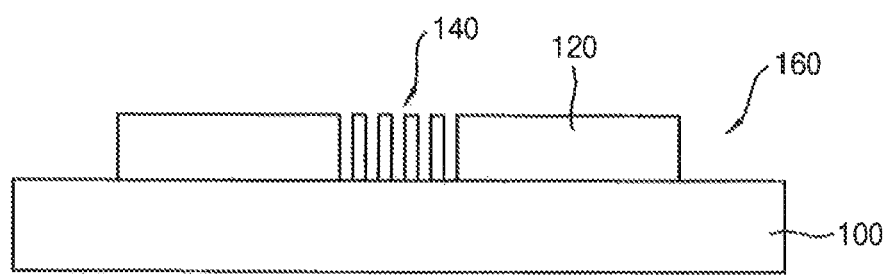

Referring to FIG. 13, the metal layer pattern 144 is etched by using the second photoresist pattern 150 as an etching mask, and the second photoresist pattern 150 is removed.

For example, the metal layer pattern 144 is etched by performing a dry etching process using plasma such as PECVD, or a wet etching process. Accordingly, a portion of the metal layer pattern 144 is removed to transform the metal layer pattern 144 into the polarizing pattern 140.

In addition, the second photoresist pattern 150 may be removed to expose the blocking pattern 120 and the polarizing pattern 140. For example, a cleaning process such as an ashing process may be performed to remove the second photoresist pattern 150.

When the light polarized at the first polarizing angle by an exposure (not illustrated) is incident on the polarizing pattern 140, the polarizing pattern 140 may polarize the light at a second polarizing angle.

The polarizing pattern 140 may control an exposure amount by using a difference between the first and second polarizing angles. For example, if the first polarizing angle and the second polarizing angle are the same as each other, the polarizing pattern 140 may transmit the entire light incident on the polarizing pattern 140. In addition, if the first polarizing angle is substantially perpendicular to the second polarizing angle, the polarizing pattern 140 may block the entire light incident on the polarizing pattern 140.

For example, the exposure amount may be inversely proportional to the difference between the first and second polarizing angles, and the exposure amount may be adjusted by the difference between the first and second polarizing angles.

In an exemplary embodiment of the present invention, the polarizing pattern 140 may include a wire grid pattern.

The wire grid pattern may be formed of a stripe-like metal wire grid pattern having a line width and spacing that are smaller than the size of the respective wavelengths of red (R), green (G) and blue (B) light, i.e., within a visible light region detectable by human. The incident light in parallel to the stripe pattern may pass through the wire grid pattern, and the wire grid pattern may polarize the incident light.

In addition, the wire grid pattern may have a stripe pattern having a line width and spacing in a range of about 50 nm to 200 nm, i.e., smaller than the minimum optical wavelength of light that is visible.

By the method of manufacturing the photo mask according to an exemplary embodiment of the present invention, the light emitted by the exposure and polarized at the first polarizing angle may be polarized at the second polarizing angle by the wire gird pattern.

The difference between the first polarizing angle of the light by the polarizing filter of the exposure and the second polarizing angle of the light by the polarizing pattern of the photo mask may be adjusted so that the exposure amount by the photo mask is controlled. Accordingly, without replacement of the photo mask and stop of the manufacturing process, a thin film transistor may be manufactured continuously to increase productivity. In addition, the existing photo mask may be utilized and it may reduce production cost.

Hereinafter, a display panel will be mainly explained.

Figure 14:
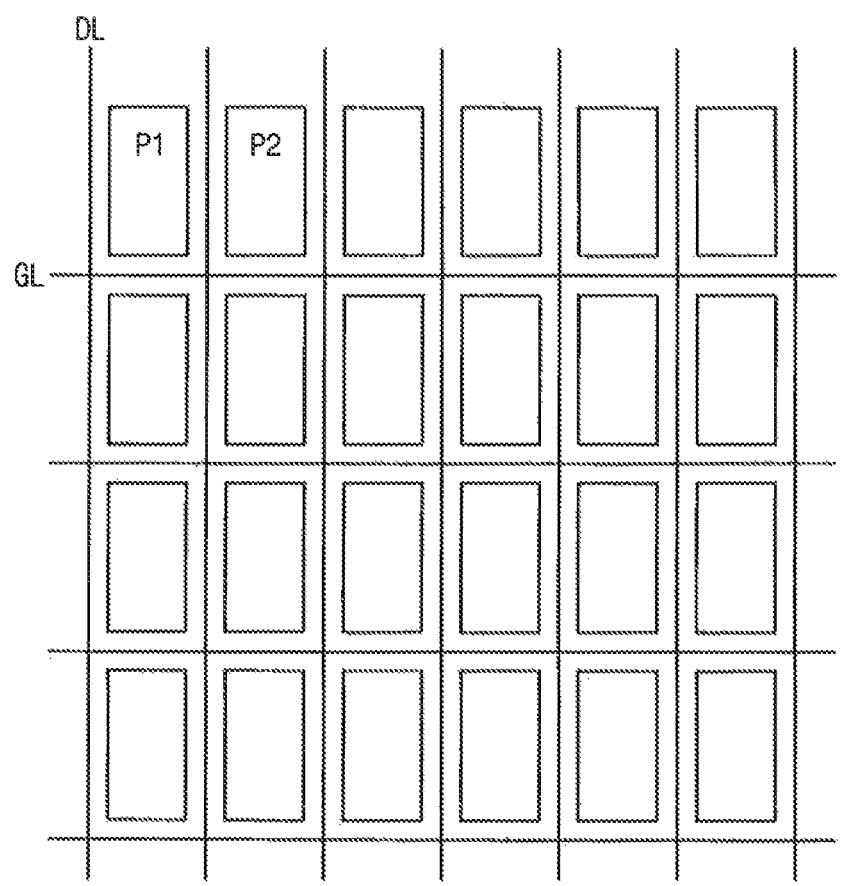
FIG. 14 is a cross-sectional view of a display panel according to an exemplary embodiment of the present invention.
Figure 15:
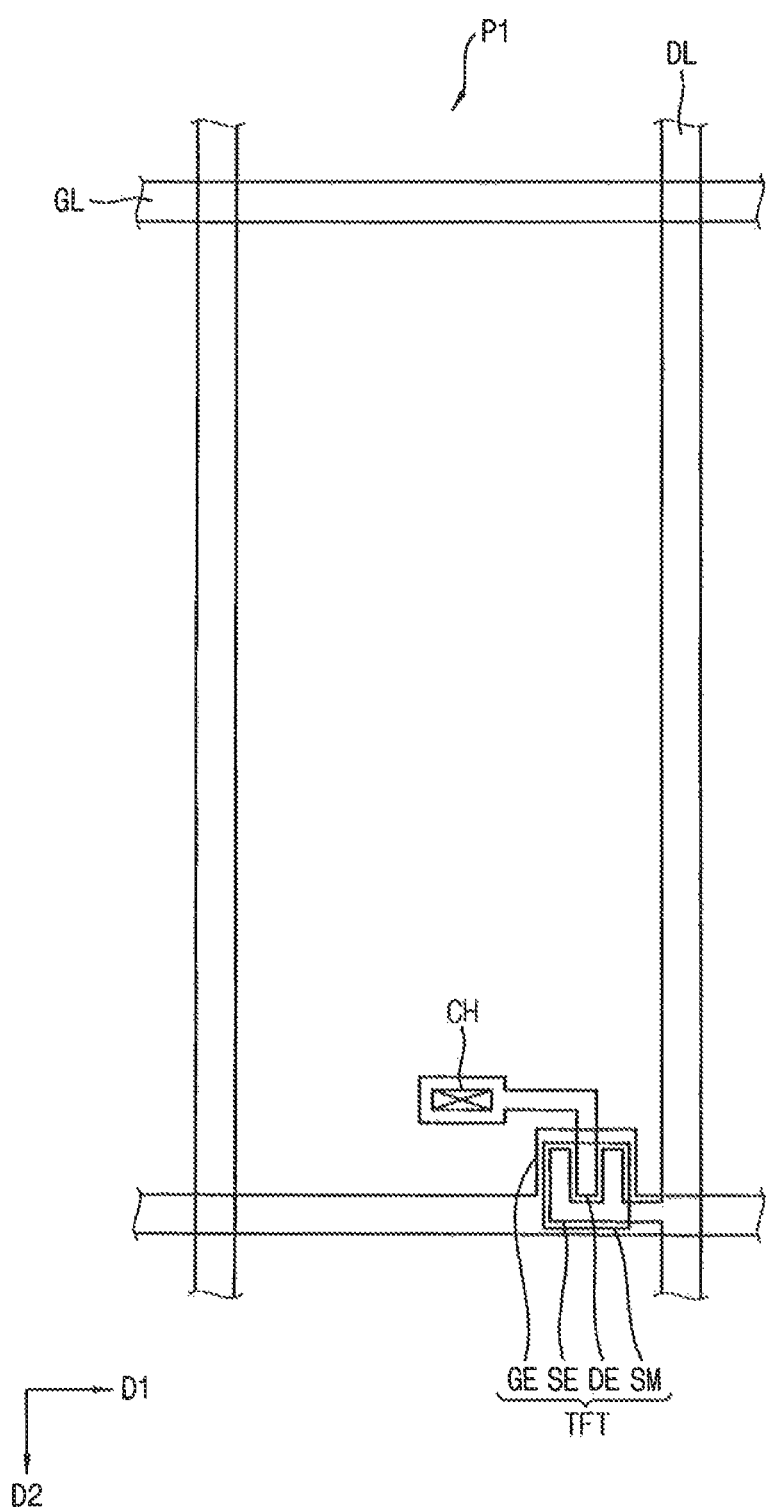
FIG. 15 is a plan view of a first pixel in FIG. 14.

FIG. 14 is a cross-sectional view illustrating a display panel according to an exemplary embodiment of the present invention. FIG. 15 is a plan view illustrating a first pixel in FIG. 14.

Referring to FIGS. 14 and 15, a display panel includes a plurality of gate lines GL, a plurality of data lines DL and a plurality of pixels.

The plurality of gate lines may extend in a first direction D1. The plurality of data lines may extend in a second direction D2 crossing (e.g., substantially perpendicular to) the first direction D1. Alternatively, although not illustrated in FIG. 1, the plurality of gate lines may extend in the second direction D2, and the plurality of data lines may extend in the first direction D1.

Pixels are arranged in a matrix form. Each pixel is disposed in a respective pixel area that are defined by a gate line GL and a data line DL.

Each pixel may be connected to a respective one of the gate lines (e.g., an adjacent one gate line) and a respective one of the data lines (e.g., an adjacent one data line).

Each pixel has, but are is limited to, a rectangular shape. Alternatively, each pixel may have a V shape, a Z shape, etc.

The display panel includes a substrate including pixel areas configured to display image and a thin film transistor TFT. The pixel areas may be arranged in a matrix form having a plurality of columns and a plurality of rows.

Each pixel area may include a switching element. For example, the thin film transistor TFT may be the switching element. The switching element may be connected to the respective one of the gate lines (e.g., the adjacent one gate line) and the respective one of the data lines (e.g., the adjacent one data line). The switching element may be disposed on an area where the gate line GL crosses the data line DL.

A gate pattern including a gate electrode GE and the gate line GL is disposed on the substrate. The gate line GL is electrically connected to the gate electrode GE.

A semiconductor pattern SM is disposed on the substrate. The semiconductor pattern SM overlaps the gate electrode GE.

A data pattern including the data line DL, a source electrode SE and a drain electrode DE may be disposed on the semiconductor pattern SM. The source electrode SE overlaps the semiconductor pattern SM and is electrically connected to the data line DL.

The drain electrode DE is spaced apart from the source electrode SE on semiconductor pattern SM. The semiconductor pattern SM may have a conductive channel between the source electrode SE and the drain electrode DE.

The thin film transistor TFT includes the gate electrode GE, the source electrode SE, the drain electrode DE and the semiconductor pattern SM.

FIGS. 16 to 23 are cross-sectional views for illustrating a method of manufacturing a thin film transistor.

Figure 16:
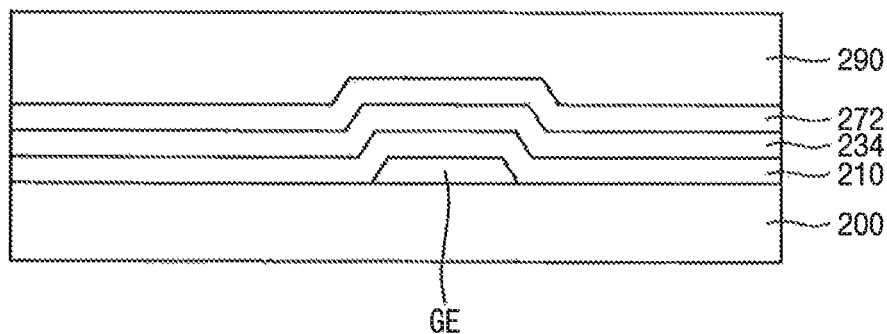
FIGS. 16 to 22 are cross-sectional views for illustrating a method of manufacturing a thin film transistor according to an exemplary embodiment of the present invention.

Referring to FIG. 16, a gate electrode GE is formed on a base substrate 200. A gate insulation layer 210, an active layer 234, a data metal layer 272 and a third photoresist layer 290 are sequentially formed on the gate electrode GE and a top surface of the base substrate 200 not covered by the gate electrode GE.

The base substrate 200 may support material on the base substrate 200, transmitting incident light. For example, the base substrate 200 may be formed of a glass substrate or a transparent plastic substrate.

The gate electrode GE may include at least one of aluminum (Al), titanium (Ti), copper (Cu), molybdenum (Mo), tantalum (Ta), tungsten (W), neodymium (Nd), Chromium (Cr), Silver (Ag), copper oxide (CuOx) and etc. The gate electrode GE may include at least one of gallium doped zinc oxide (GZO), indium doped zinc oxide (IZO), copper-manganese alloy (CuMn) and etc.

The gate insulation layer 210 may be formed of a transparent, insulating material such as silicon oxide (SiOx), silicon nitride (SiNx) and etc.

The active layer 234 may be formed of at least one of indium (In), zinc (Zn), gallium (Ga), tin (Sn), hafnium (Hf) and etc. For example, the active layer 234 may be formed of an oxide semiconductor layer including indium gallium zinc oxide (IGZO), indium tin zinc oxide (ITZO), hafnium indium zinc oxide (HIZO) and etc.

The data metal layer 272 may be formed of at least one of aluminum (Al), titanium (Ti), copper (Cu), molybdenum (Mo), tantalum (Ta), tungsten (W), neodymium (Nd), Chromium (Cr), Silver (Ag) and etc.

The third photoresist layer 290 may be stacked on the data metal layer 272. For example, the third photoresist layer 290 may be formed of a positive-type photoresist material. Alternatively, the third photoresist layer 290 may be formed of a negative-type photoresist material.

Figure 17:
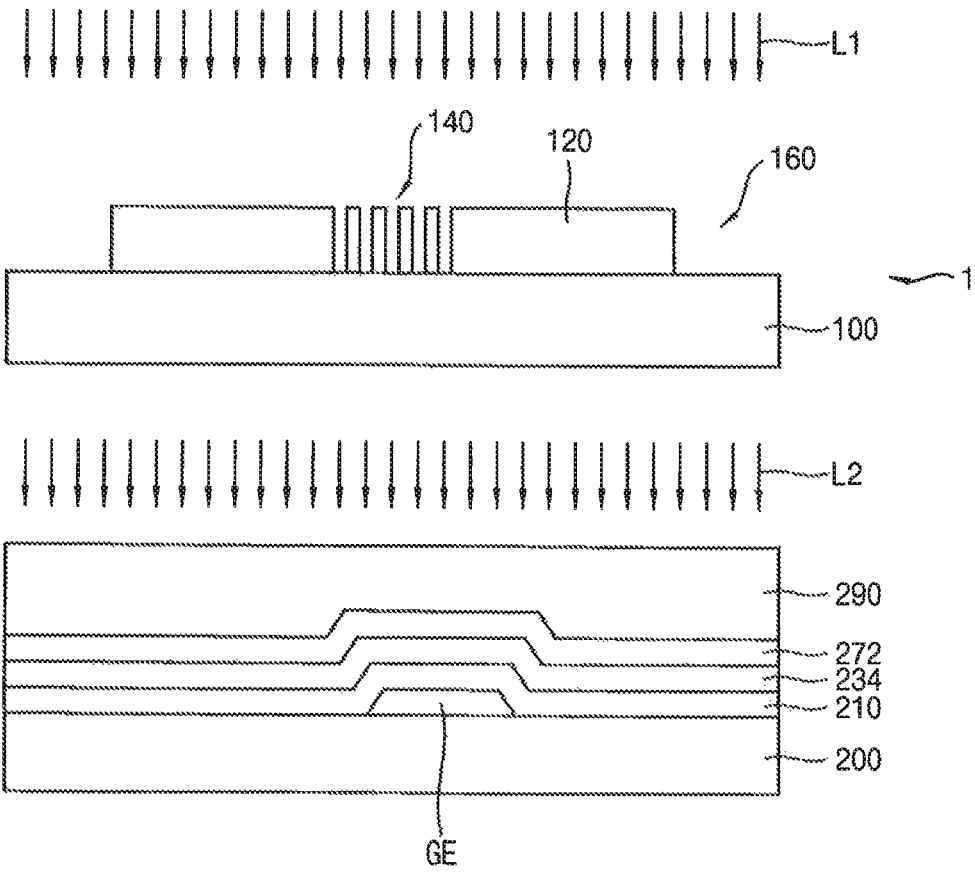

Referring to FIG. 17, a photo mask 1 is disposed between an exposure (not illustrated) and the third photoresist layer 290, and the third photoresist layer 290 is exposed by light L1 emitted from the exposure through the photo mask 1.

Light L1 emitted by the exposure may be polarized at a first polarizing angle by a polarizing filter of the exposure. If an angle of the polarizing filter is changed, the first polarizing angle may be adjusted.

The light L1 polarized at the first polarizing angle may be incident on a blocking pattern 120, a polarizing pattern 140 and a transmitting pattern 160 of the photo mask 1. For example, the polarizing pattern 140 may include a wire grid pattern.

A portion of the light L1 incident on the blocking pattern 120 may be blocked, a portion of the light L1 incident on the transmitting pattern 160 may be transmitted, and a portion of the light L1 incident on the polarizing pattern 140 may be polarized at a second polarizing angle and may be transformed into light L2 polarized at the second polarizing angle. The light L2 polarized at the second polarizing angle may be incident on the third photoresist layer 290.

An exposure amount of the third photoresist layer 290 may be inversely proportional to the difference between the first and second polarizing angles, and the exposure amount may be adjusted by the difference between the first and second polarizing angles.

A portion of the third photoresist layer 290 disposed under the transmitting pattern 160 may be more hardened by the light L2 than a portion of the third photoresist layer 290 disposed under the polarizing pattern 140. For example, the portion of the third photoresist layer 290 corresponding to the transmitting pattern 160 may be substantially entirely hardened, and the portion of the third photoresist layer 290 corresponding to the polarizing pattern 140 may be partially hardened by the light L2.

Figure 18:
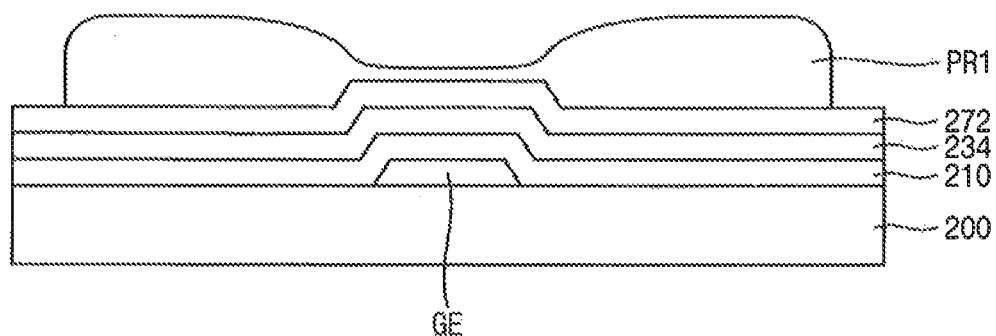

Referring to FIG. 18, the third photoresist layer 290 corresponding to the blocking pattern 120 is partially removed such that a first portion of the third photoresist layer 290 remains, and a portion of the third photoresist layer 290 corresponding to the transmitting pattern 160 is entirely removed. The third photoresist layer 290 corresponding to the polarizing pattern 140 is partially removed such that a second portion of the third photoresist layer 290 remains. The thickness of the first portion of the third photoresist layer 290 is greater than the second portion of the third photoresist layer 290. The third photoresist layer 290 is transformed into a first photo mask PR1.

For example, a first photoresist pattern PR1 is formed on the data metal layer 272. The first photoresist pattern PR1 overlaps the gate electrode GE. A thickness of a portion of the first photoresist pattern PR1 overlapping the gate electrode GE is smaller than a thickness of other portion of the first photoresist pattern PR1.

A cleaning process such as an ashing process may be performed to remove the hardened portion of the third photoresist pattern 290, and the third photoresist pattern 290 may be transformed into the first photoresist pattern PR1.

Figure 19:
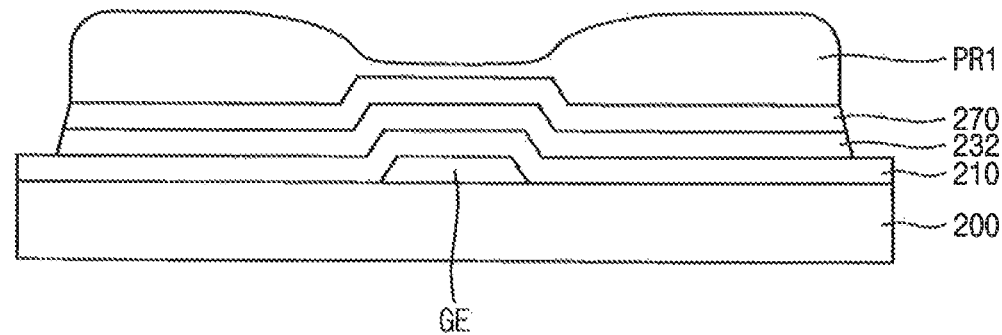

Referring to FIG. 19, the data metal layer 272 and the active layer 234 are etched using the first photoresist pattern PR1 as an etch mask, so that the data metal pattern 272 may be transformed into a data metal pattern 270 and the active layer 234 may be transformed into a active pattern 232.

For example, a portion of the data metal layer 272 and a portion of the active layer 234 may be etched by performing a dry etching process using plasma such as PECVD, or a wet etching process.

One etching process for the data metal layer 272 and other etching process for the active layer 234 may be performed simultaneously or sequentially.

Figure 20:
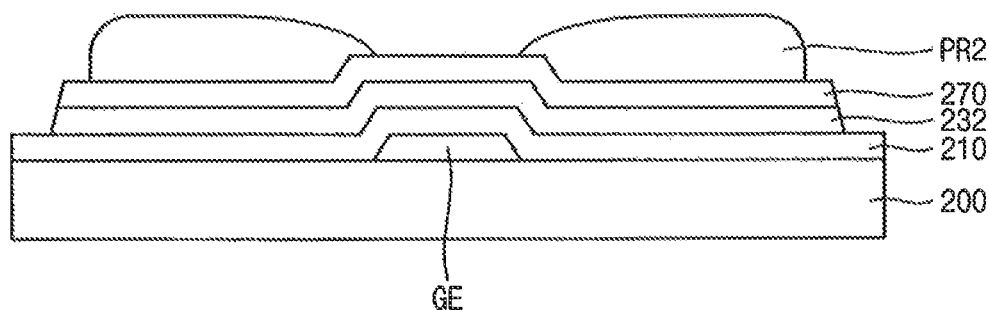

Referring to FIG. 20, a second photoresist pattern PR2 is formed by partially removing the first photoresist pattern PR1. The second photoresist pattern PR2 is formed by partially removing the first photoresist pattern PR1 in a thickness direction. For example, the second photoresist pattern PR2 is formed by removing the first portion of the first photoresist pattern PR1.

A top surface of the data metal pattern 270 is partially exposed by the second photoresist pattern PR2. For example, a central portion of the top surface of the data metal pattern 270 is exposed.

Figure 21:
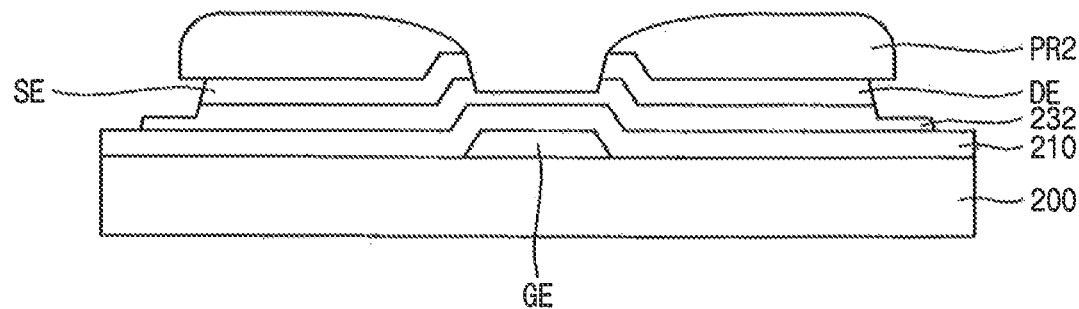

Referring to FIG. 21, the data metal pattern 270 is etched using the second photoresist pattern PR2 as a etch mask. An exposed portion of the data metal pattern 270 is etched, so that source and drain electrode SE and DE may he formed.

A portion of the active pattern 232 may be removed by using the second photoresist pattern PR2 as a etch mask. One etching process for the data metal pattern 270 and other etching process for the active pattern 232 may be performed simultaneously or sequentially. Alternatively, the etching process for the active pattern 232 may be omitted.

Figure 22:
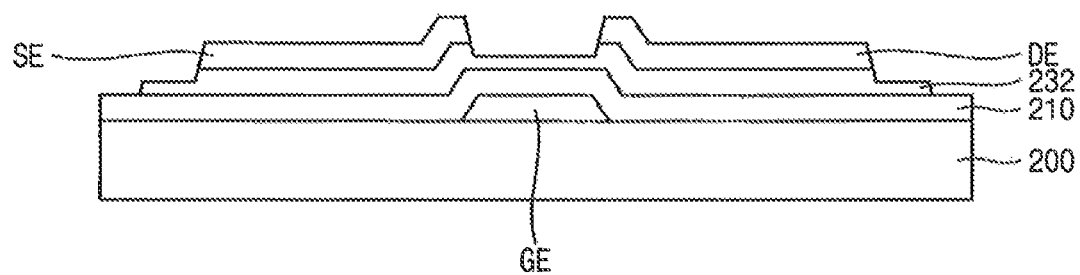

Referring to FIG. 22, the second photo mask is removed to expose the source electrode SE and the drain electrode DE such that a thin film transistor is manufactured. For example, a cleaning process such as an ashing process may be performed to remove the second photo mask PR2.

By the method of manufacturing the thin film transistor according to an exemplary embodiment of the present invention, the light emitted by the exposure and polarized at the first polarizing angle may be polarized at the second polarizing angle by the wire gird pattern.

The difference between the first polarizing angle of the light by the polarizing filter of the exposure and the second polarizing angle of the light by the polarizing pattern of the photo mask may be adjusted to control the exposure amount by the photo mask. Accordingly, without break of a manufacturing process to replace a photo mask, a thin film transistor may be manufactured continuously to increase productivity. In addition, the existing photo mask may be utilized and it may reduce production cost.

While the present invention has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of manufacturing a thin film transistor, the method comprising:
    forming a metal layer on a base substrate;
    forming a photoresist layer on the metal layer;
    emitting light polarized at a first polarizing degree by an exposure;
    providing a photomask between the exposure and the photoresist layer so that the photomask receives the polarized light from the exposure, wherein the photomask includes a transparent area and a polarizing area including a polarizing pattern having a second polarizing degree different from the first polarizing degree, so that a first light amount exiting from the polarizing area is smaller than a second light amount exiting from the transparent area, and a difference between the first light amount and the second light amount depends on a difference between the first and second polarizing degrees;
    forming a photoresist pattern by developing the photoresist layer so that the photoresist pattern includes a first portion exposed by the first light amount and a second portion exposed by the second light amount, the first portion being thinner than the second portion; and
    etching the metal layer by using the photoresist pattern as an etch mask.

2. The method of claim 1, wherein the emitting of the light polarized at the first polarizing degree includes:
    emitting the light polarized at the first polarizing degree by using a polarizing filter of the exposure.

3. The method of claim 1, wherein the polarizing pattern includes a wire grid pattern.

4. The method of claim 3, wherein the wire grid pattern includes a high reflective metal.

5. The method of claim 3, wherein the wire grid pattern includes aluminum (Al).

6. The method of claim 3, wherein the wire grid pattern has a stripe pattern.

7. The method of claim 6, wherein the stripe pattern has a line width of about 50 nm to about 200 nm.

8. The method of claim 1, wherein the polarizing pattern includes polymer resins.

9. The method of claim 1, wherein the photomask further comprises:
    a plurality of blocking patterns disposed on the transparent substrate, and
    wherein the polarizing pattern is provided between the blocking patterns.

10. The method of claim 9, wherein the blocking patterns include chromium (Cr).

* * * * *